United States Patent
Polanyi et al.

[11] Patent Number: 6,156,393
[45] Date of Patent: Dec. 5, 2000

[54] METHOD OF MOLECULAR-SCALE PATTERN IMPRINTING AT SURFACES

[75] Inventors: John C. Polanyi, 142 Collier Street, Toronto, Ontario, Canada, M4W 1M3; Duncan Rogers, Palace Happiness #303 1-18-5 Sengen, Tsukuba, Ibaraki 305, Japan

[73] Assignees: John C. Polanyi, Toronto, Canada; Duncan Rogers, Tsukuba, Japan

[21] Appl. No.: 08/967,891

[22] Filed: Nov. 12, 1997

[51] Int. Cl.$^7$ ................................................ B05D 3/06
[52] U.S. Cl. ..................... 427/533; 427/553; 427/552; 427/534; 427/555; 216/94; 438/694; 438/765; 438/769; 438/767
[58] Field of Search .................... 427/510, 511, 427/515, 497, 498, 503, 504, 526, 527, 533, 534, 552, 553, 555, 581, 546, 597, 595, 576; 216/2, 12, 94; 438/694, 66, 765, 795, 796, 798, 767, 769

[56] References Cited

U.S. PATENT DOCUMENTS

| | | | |
|---|---|---|---|
| 4,340,617 | 7/1982 | Deutsch et al. | 427/581 |
| 4,608,117 | 8/1986 | Ehrlich et al. | |
| 4,615,904 | 10/1986 | Ehrlich et al. | |
| 4,701,347 | 10/1987 | Higashi. | |
| 5,035,782 | 7/1991 | Tamura et al. | 427/504 |
| 5,112,434 | 5/1992 | Goldberg | 427/581 |
| 5,273,788 | 12/1993 | Yu | 427/581 |
| 5,279,867 | 1/1994 | Friedt et al. | 427/581 |
| 5,322,988 | 6/1994 | Russell et al. | |
| 5,393,699 | 2/1995 | Mikoshiba et al. | 427/576 |
| 5,405,481 | 4/1995 | Licoppe et al. | |
| 5,492,734 | 2/1996 | Matsumoto et al. | 427/576 |
| 5,512,328 | 4/1996 | Yoshimura et al. | 427/503 |
| 5,645,897 | 7/1997 | Andra. | |
| 5,935,454 | 8/1999 | Tada et al. | 427/552 |
| 6,007,969 | 12/1999 | Hatakeyama et al. | 427/552 |

FOREIGN PATENT DOCUMENTS 3725169 2/1989 Germany.

OTHER PUBLICATIONS

Abstract of Japan; Pub #09223455, date Aug. 26, 1997, Inventor P. Harubuoe.

(List continued on next page.)

*Primary Examiner*—Marianne Padgett
*Attorney, Agent, or Firm*—Lynn Schumacher; Hill & Schumacher

[57] ABSTRACT

A method for mask-free molecular or atomic patterning of surfaces of reactive solids is disclosed. A molecular-scale pattern of adsorbate molecules is used in place of the conventional macroscopic "mask". Molecules adsorb at surfaces in patterns, governed by the structure of the surface, the chemical nature of the adsorbate, and the adsorbate coverage at the surface. The surface is patterned and then marked or imprinted with the pattern by inducing localized chemical reaction between adsorbate molecules and the surface of the solid, resulting in an imprint being formed in the vicinity of the adsorbate molecules. In one aspect of the invention, photoinduced reaction of the patterned adsorbate leads to patterned photoreaction with the surface. The photoreaction can take the form of patterned photoattachment to the surface (patterned "writing" or "doping") or patterned photoremoval of atoms from the surface ("etching" which takes place in the initial reaction or through subsequent photoirradiation of the photopatterned surface). The adsorbate when irradiated with light, electrons or ions imprints a pattern on the substrate by localised reaction. The new method is exemplified by the case of a silicon substrate and chlorobenzene molecules which first adsorb in a pattern on a silicon crystal, and which when irradiated chlorinate the crystal in a similar pattern to that of the adsorbate. The method is suitable for the writing, doping or etching of molecular-scale features.

37 Claims, 2 Drawing Sheets

Distribution of Chlorobenzene Over F and U Before Irradiation, And Distribution of Atomic Cl Formed By Irradiation

OTHER PUBLICATIONS

Anonymous, "Fabrication of Gold Nanostructures by Lithography with Self–Assembled Monolayers", *IBM Technical Disclosure Bulletin,* vol. 39, No. 12, Dec. 1996, pp. 235–238, NY.

M. Balooch and W.J. Siekhaus, "Spontaneous and STM–Induced Reaction of XeF2 with Si(111)–7×7 at Low Coverage", *nanotechnology* 7, 1996 (No Month) pp. 356–359, IOP Publishing Ltd., UK.

Chen X. H. et al., "Photoetching of Si(111)–(7×7) Studied by STM", *Surface Science,* Apr. 10 1997, Elsevier, Netherlands, vol. 376, No. 1–3, pp. 77–86.

Chen X. H. et al., "Adsorption of $C_6H_5Cl$ on Si(111) 7×7 Studied by STM", *Surface Science,* Oct. 20, 1995, Elsevier Netherlands, vol. 340, No. 3, pp. 224–230.

"Laser–induced microscopic etching of GaAs and InP", D. J. Ehrlich, R. M. Osgood, Jr., and T.F. Deutsch, 1980 American Institute of Physics; Appl. Phys. Lett 36(8), Apr. 15, 1980 pp. 698–700.

"Conversion of SiCl Pair and Island Sites to SiCl Single Site upon Annealing of Ci/Si(111)–7×7 Surfaces," Chun Yan, John A. Jensen and Andrew C. Kummel, 1995 American Chemical Society, J. Phys. Chem. vol. 99, No. 16, 1995, pp. 6084–6090 No Month.

← Clean

−1V

Picture at top left is an STM image of Si(111) 7x7, using -1V tip-voltage.

1L ClBz →

−1.9V

Chlorinated

−1V          −3V

Increase in negative tip-bias causes Cl atoms to "light up", at right.

Distribution of Chlorobenzene Over F and U Before Irradiation, And Distribution of Atomic Cl Formed By Irradiation

METHOD OF MOLECULAR-SCALE PATTERN IMPRINTING AT SURFACES

FIELD OF THE INVENTION

The present invention relates to a method for pattern imprinting, on an atomic or molecular-scale, of the surface of a solid by inducing localized chemical reaction between adsorbate molecules and the surface of the solid.

BACKGROUND OF THE INVENTION

Progress in the hundred billion dollar semi-conductor industry depends, in part, on the ability to mark (i.e. write, dope or etch) a surface with small features at controlled separations. The current limit is the making of marks separated by a few tenths of a nanometre (commonly 0.3 microns, i.e. 3,000 Å, which is roughly one thousand atoms separation). Patterns of these dimensions constitute the lower limit of what can be achieved by the conventional method of marking, which involves the use of a patterned mask to shield portions of the surface from the agent (electrons, light or chemicals) used in order to mark the surface. It has not proved possible to make patterned masks having features smaller than tenths of a micron. Moreover, masks with such small features already suffer from irreproducibility.

U.S. Pat. No. 5,645,897 issued to Andra discloses a method for surface modification by ion bombardment of the surface or the region in front of the surface portion being etched or coated. The ion source is chosen to produce ions which are highly charged and possessing kinetic energies sufficiently high to permit the ions to approach the surface but low enough to prevent penetration of the surface. A stated advantage of the process of this patent is that the highly charged state of the ions and their low kinetic energies results in very localized energy deposition thereby giving rise to improved spatial resolution in the imprinting of patterned masks for etching or coating the surface. This patent also discloses combining the feature of localized energy deposition using the ion beams with conventional lithographic masking techniques for producing precise etching patterns.

U.S. Pat. No. 5,405,481 issued to Licoppe et al. is directed to a gas photonanograph device for production of nanometre scale surface patterns. The device includes a head comprising a fiber optic cable terminating in a tip and microcapillary channels also terminating at the tip that feed reactive gas from a gas reservoir. The tip is spaced from the area of the substrate surface being light activated. Nanopatterns can be produced by scanning this device, as one might write with a pen, the tip of the pen here being a focussed light source.

U.S. Pat. No. 4,701,347 issued to Higashi specifically mentions the photolysis of molecules adsorbed on a surface as a method for growing patterned metal layers on semi-conductor. However, in common with earlier patents cited therein, going back to U.S. Pat. No. 3,271,180 issued on Sep. 6, 1966, the pattern of photolytic and thermal reaction induced by illumination of the adsorbate derives from the presence of a mask between the light source and the adsorbed layer.

U.S. Pat. No. 5,322,988, in common with U.S Pat. No. 4,701,347 referred to above, uses laser irradiation to induce photochemical and thermal reaction between an adsorbate layer and the underlying substrate, but the reaction etches rather than writes (the etching is termed "texturing"). Reaction, it is stated, only occurs where the laser is impinging with sufficient fluence, i.e. patterned illumination (as beneath a "mask") is the source of patterned etching.

D. J. Ehrlich et al. in Appl. Phys. Lett. 36, 698 (1980) describe a method of mask-free etching of semiconductors based on the ultraviolet photolysis of gaseous methyl halides. The place of the patterned mask is taken by an interference pattern, i.e. it derives, once more, from patterned irradiation of the surface.

U.S. Pat. Nos. 4,608,117 and 4,615,904 issued to Ehrlich et al., disclose maskless growth of patterned films. This method describes a two-step process. In step one a pattern is written on the surface using a focussed light-beam or electron-beam as a pen, and photodissociation as the agent for writing (the ink). Once a 1–2 monolayer pattern of metal or semiconductor has been written in this fashion, step two involves uniform irradiation of the gaseous reagent and the surface which results in the accumulation of material on the "prenucleated sites", i.e. in the close vicinity of the pattern of deposition formed in step one. Consequently this second growth-phase is mask-free. In the mask-free film-growth phase "atoms are provided dominantly by direct photodissociation of the gas-phase organometallic molecules." (U.S. Pat. No. 4,608,117, column 2, lines 12 and 13). Film growth, it is stated, occurs selectively in the prenucleated regions where impinging atoms originating in the gas phase have a higher sticking coefficient at the surface.

U.S. Pat. No. 5,129,991 issued to Gilton describes an alternative scheme for mask-free etching. An adsorbed etch-gas (a chloride or fluoride) is present on a substrate which has macroscopic regions fabricated from different materials having different photoemission threshold-values for the release of electrons. This substrate is illuminated with a wavelength of light selected to give electron emission from some regions but not from others. The emitted electrons cause etching to occur only on those regions of the substrate which are composed of materials with a low enough photoemission threshold to emit electrons; i.e., reaction is localised, but localised to macroscopic areas.

C. Yan et al., J. Phys. Chem., 99 6084 (1995), have reported that molecular chlorine impinging as an energetic (0.11 eV) beam of molecules on a Si(111) 7×7 substrate reacts directly from the gas to halogenate the substrate preferentially at surface silicon-atom sites which are adjacent to one another (70% adjacent, 30% non-adjacent). Though these chlorinated pairs of sites recur randomly across the surface, they constitute short-range order, i.e., a simple form of molecular-scale patterning.

It is well known that one can produce a pattern on a surface by adsorbing a weakly-bound layer of molecules which, in their most stable configuration, form a pattern. The existence of such adsorbate patterns has been shown incontrovertibly by Scanning Tunnelling Microscopy (STM) which reveals the locations and separations of the adsorbate molecules (refs. 1–4). The origin of these spontaneously-formed molecular patterns has been the subject of theoretical analysis (e.g., refs. 5–7).The patterns are governed by the effect on the adsorbate of the regular arrangement of the atoms in the underlying crystal (termed the "substrate"), by the size and shape of the adsorbed molecules themselves which can interact with one another to form an adsorbate pattern due to that cause alone, and by the coverage which determines the inter-adsorbate separation and hence affects the favoured pattern of adsorption. Through the choice of these variables (substrate, adsorbate and coverage) one obtains differing patterns. These adsorbate patterns repeat at intervals as small as a few atomic diameters.

Typically, what are termed 'adsorbate layers' have heats of adsorption of 0–1 eV. At the low end of this range they are said to be 'physisorbed', and at the high end 'chemisorbed'. They are adsorbate layers by virtue of the fact that they are subject to desorption, with a heat of desorption corresponding to the prior heat of adsorption, by warming the surface.

It would be advantageous to exploit the existence of these molecular-scale adsorbate patterns as a means to mark the underlying surface. This would provide an avenue to mask-free marking and, more importantly, to marking at separations at least a hundred times less than the lowest limit achievable through the use of the present procedures employing masks.

SUMMARY OF THE INVENTION

It is an object of the present invention to provide a process for marking solid surfaces with patterns of molecular dimensions.

In the present invention a molecular-scale pattern, that derives from the presence of a pre-existent molecular-scale pattern in an adsorbate layer, is imprinted upon the surface. If an adsorbate is to be found attached to preferred sites at a surface, that recur at intervals across the surface, we refer to the adsorbate as 'patterned'.

The present invention provides a process for the formation of regular patterns upon solid surfaces, repeated at intervals of less than or of the order of 0.3 microns (3,000 Å). The material to be marked is exposed to a gas or liquid that adsorbs to form, spontaneously, an ordered monolayer. This ordering will in general be most complete if the adsorbate is "annealed", i.e., warmed sufficiently to render it mobile. In some cases (e.g., that exemplified here) the adsorbate is sufficiently mobile that annealing is unnecessary.

In one aspect of the invention there is provided a method of patterning a surface of a solid on a molecular scale. The method comprises providing a reactive solid having a surface, and forming a pattern of adsorbed molecules on the surface of the reactive solid by providing a plurality of preselected molecules and exposing the surface to the preselected molecules, and forming an imprinted a pattern covering less than every surface atom on the surface by irradiating the surface and pattern of adsorbed molecules with effective excitation energy to the pattern of adsorbed molecules form a chemical bond between at least one constituent of the individual adsorbed molecule and the reactive solid locally to a site of adsorption of the indivdual adsorbed molecule on to the surface.

In this aspect of the invention the reactive solid may be a crystalline solid or an amorphous solid having a surface.

The present invention provides a method of patterning a surface of a solid on a molecular scale, comprising providing a crystalline solid and forming a pattern of adsorbed molecules on the surface of the reactive solid by providing a plurality of preselected molecules in gas phase and exposing the surface to the preselected molecules, and forming an imprinted pattern covering less than every surface atom on the surface by irradiating the surface and pattern of adsorbed molecules with effective excitation energy to the pattern of adsorbed molecules to form a chemical bond between at least one constituent of the individual adsorbed molecule and the reactive solid locally to a site of adsorption of the individual adsorbed molecule on with the surface.

The present invention is directed to a method of patterning a surface of a solid on a molecular scale which includes providing a reactive solid having a surface, forming a pattern of adsorbed molecules at sites on the surface of the reactive solid by providing a plurality of preselected molecules and exposing the surface to the preselected molecules; and thereafter, an imprinted pattern is formed covering less than every surface atom on the surface by irradiating the surface and the pattern of the adsorbed molecules with effective excitation energy to form a chemical bond between at least one constituent of the adsorbed molecules and the reactive solid locally to the sites where the adsorbed molecules are adsorbed on the surface.

The present invention is also directed to a method of patterning a surface of a solid on a molecular scale, which includes providing a reactive crystalline solid having a surface; forming a pattern of adsorbed molecules at sites on the surface of the reactive crystalline solid by providing a plurality of preselected molecules and exposing the surface of the preselected molecules in gas phase; thereafter, an imprinted pattern is formed covering less than every surface atom on the surface by irradiating the surface and the pattern of the adsorbed molecules with effective excitation energy to form a chemical bond between at least one constituent of the adsorbed molecules and the reactive crystalline solid locally to the sites where the adsorbed molecules are adsorbed on the surface.

Some factors governing the pattern of order in an adsorbate layer (substrate crystal structure, adsorbate molecular-shape, and coverage) were given in the previous section. We note here that control over adsorbate patterning can also be achieved using different crystal faces or by the deliberate introduction of patterned defects. Patterned defects are commonly obtained by cutting a substrate crystal at a known angle to create a predictable pattern of steps and terraces on the atomic scale (see ref. 8). A further means of obtaining patterned defects, now well established, is through the application of voltage or current pulses to the tip of an STM, which removes or adds atoms where the tip is applied (see ref. 9). Whichever of these means are used to introduce a pattern of defects at the substrate surface, a corresponding patterning will be obtained in the adsorbate layer that is subsequently deposited.

The ordered adsorbate layer, on the surface, may be excited by irradiation using light (photons) or charged particle bombardment (electrons or ions) so that a reaction between the patterned adsorbate and the substrate occurs. This has the consequence that the adsorbate pattern is imprinted upon the surface. Since the adsorbate pattern repeats at molecular intervals, so does the imprinted pattern.

In one aspect of the invention the agent for marking the surface is the intact adsorbate molecule which has been excited by irradiation of the adsorbate and surface.

In another aspect of the invention the agent for marking the surface is a chemically reactive fragment formed from the adsorbate molecule as a result of the joint irradiation of the adsorbate and substrate.

In one aspect of the invention the agent which excites the adsorbate is the direct absorption of ultraviolet radiation by the adsorbate molecules.

In another aspect of the invention the agent which excites the adsorbate is the impact of substrate electrons at the sites of adsorbed molecules, these substrate electrons having themselves been excited by impacting photons, electrons or ions which energise a portion of the substrate electrons.

In a variant on substrate-mediated adsorbate excitation, electronic excitation of the substrate leads to energy-transfer to the adsorbate without transferring an electron, by the so-called 'electronic-to-electronic energy-transfer' mechanism.

The above aspects contribute to the example of chlorobenzene adsorbed on a silicon wafer irradiated by ultraviolet radiation, disclosed herein. The novelty, and surprising results forming the present invention, consists not in the presence of patterned adsorbates, nor in the direct photoexcitation and photodisssociation of adsorbates, nor in the electron-impact excitation and dissociation of adsorbate by substrate electrons, nor in the use of an external electron beam to induce adsorbate excitation and reaction, nor in the use of other charged-particle beams namely ions to induce adsorbate excitation, but in the localised nature of the ensuing reaction, which is responsible for the transference of the adsorbate pattern to the substrate.

A variant of the invention disclosed herein is that electrons coming from an external source could take the place of light as the primary agent that excites the patterned adsorbate and causes it to imprint its pattern upon the underlying surface. Electron irradiation and photoirradiation are known to have comparable effects. It follows that other charged particles, namely charged molecules termed ions, can also be used for irradiation.

The reaction of the irradiated adsorbate with the substrate may equally-well be that of an excited intact adsorbate molecule, or of a molecular fragment of that molecule, or of its atomic fragment. Following the reaction the product may be chemically bound at the surface (localised "writing") or imbedded in the surface (localised "doping") or may evidence itself as a localised removal of surface atoms as a consequence of the localised reaction (localised "etching") or evidence itself by the preferential atomic-scale pitting of the surface at the site of attachment of a chemically-bound species in the course of subsequent irradiation. The last scenario makes it possible to translate the patterned attachment of chemical groups ("writing") described here, into a similar pattern of "pits" ("etched" hollows, one or more atoms in diameter) thus further extending the range of useful application.

A further aspect of this invention is its "reinforcing" nature. Successive adsorption-irradiation cycles will cause the annealed adsorbate layer (prior to irradiation) to seek out, or in some cases avoid, the sites at which the first pattern was imprinted. Thus, by way of example, adsorbates will collect preferentially in the region of a "pit" in the surface to form a pattern. When, therefore, a second application of adsorbate is followed by irradiation, reaction will occur once more preferrentially at the sites of the prior imprinting (this being in general the site of secondary adsorption). Thus secondary and subsequent patterned-adsorption plus irradiation-imprinting can be used to enlarge, or chemically change, a primary imprint. The primary imprint, it should be understood, may have been made by the present method or alternatively by the tip of an atomic writing/etching instrument such as the Scanning Tunneling Microscope (STM) (see ref. 9). This "reinforcing" application will be important in permitting the uses of this method of adsorption-plus-irradiation to increase the size of primary "pits" in secondary and subsequent "etches", and to write or dope with selected chemical agents in the vicinity of prior marks.

Since each reactive or etching event is triggered by the arrival at the adsorbate-plus-surface of a photon, electron or ion, and since the number of such photons or electrons is readily counted and controlled, both the primary and subsequent reaction, dope, or etch, is controllable as to the number of atoms involved. What is being described is, therefore, a means for patterned writing, etching and doping that is subject to digital control.

BRIEF DESCRIPTION OF THE DRAWINGS

The method of marking or patterning a surface on a molecular scale forming the subject of this invention will now be described, reference being made to the accompanying Figures, in which:

FIG. 1(a) is an STM image of clean Si(111)7×7. The unit cell indicated is 0.00269 microns (26.9 Å) along one side. FIG. 1(b) is a similar surface of FIG. 1(a) dosed with 1L of ClBz. The dark shadows are the ClBz molecules; it is evident that they adsorb preferentially on the F sites. FIG. 1(c) shows two scans of a partially chlorinated region of an Si(111)7×7 surface (previously exposed to $Cl_2$, for this illustration). The dark shadows at −1V show themselves to be Cl bound to Si since they "light up" (i.e., current flows) when the STM tip-bias is changed to −3V. Chlorobenzene (ClBz) does not "light up" in the range −1 to −3V.

DETAILED DESCRIPTION OF THE INVENTION

The method for marking a surface on an atomic or molecular scale disclosed herein will be described and illustrated hereinafter using a non-limiting, illustrative example in which a crystalline silicon wafer is marked, using as the adsorbate molecule, chlorobenzene. However, it is to be understood by those skilled in the art that the invention is in no way limited to this system but rather the chlorobenzene-silicon system serves only to illustrate the principles of the present invention.

At the outset of the illustrative studies used to demonstrate the principle of the method of marking forming this invention, a clean Si(111)7×7 wafer at room temperature was shown to be free of contamination at the atomic level by means of Scanning Tunnelling Microscopy (STM). The wafer was then exposed to approximately 1 Langmuir (1L; $10^{-7}$ torr for 10 seconds) of chlorobenzene vapour in an ultrahigh vacuum vessel. The vessel was then re-evacuated to ultrahigh vacuum (UHV). All experiments were performed under UHV. Re-examination of the surface by STM showed partial coverage of the surface by chlorobenzene (ClBz) molecules which evidenced themselves as dark spots of roughly molecular dimensions, i.e., as locally reduced current from the negatively charged STM tip (−1V) to the crystal. As expected the chlorobenzene molecule was stable in the adsorbed state on silicon.

Figure 1A:
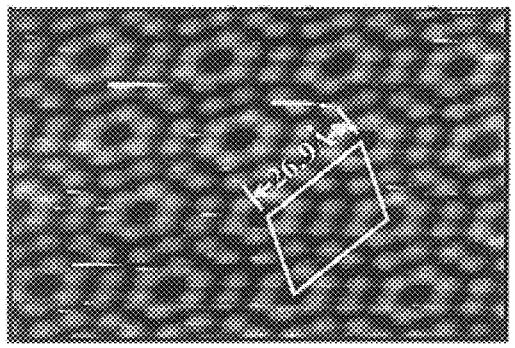
FIG. 1(a) to FIG. 1(c) are illustrative of the Scanning Tunneling Microscopy (STM) images from which the distributions of the individual ClBz (chlorobenzene) molecules and Cl (chlorine bound to Si adatoms) over the F (faulted) and U (unfaulted) halves of the Si(111)7×7 unit cells were obtained.
Figure 1B:
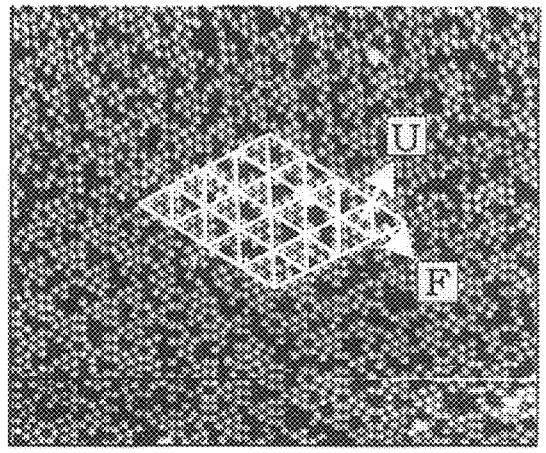
Figure 1C:
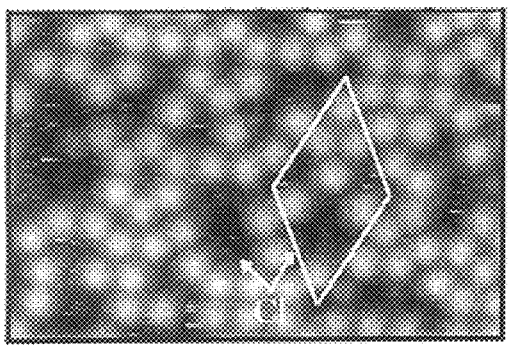
Figure 1C:
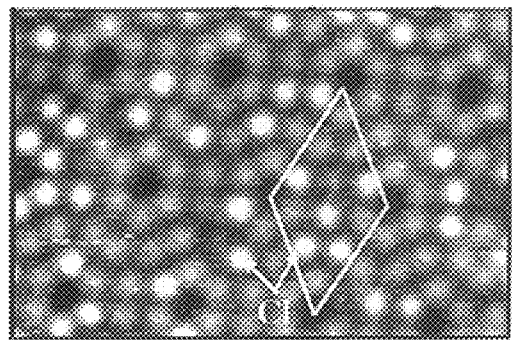

FIGS. 1(a), 1(b) and 1(c) illustrate the type of scanning tunnelling microscopy (STM) data from which the essential findings disclosed in FIG. 2 discussed hereinafter were obtained. The STM images show clean silicon (Si(111)7×7), ClBz covered silicon, and Cl covered silicon. Atomic chlorine can be distinguished from the chlorobenzene by increasing the negative tip-bias to −2V or −3V, whereupon the chlorobenzene dark spots are unaffected, but the dark spots corresponding to Cl become bright. It should be noted that the spots correspond to individual ClBz molecules or Cl atoms.

The locations of the dark spots for the chlorobenzene molecules constituted a pattern that repeated itself across the Si surface. The spots were predominantly located on the faulted (F) half of each unit cell rather than on the unfaulted (U) half (FIG. 1). This selectivity decreased with increasing coverage. This suggests that the marked preference for F over U is due to stronger adsorbate-to-substrate (ClBz to Si) bonding for F than for U rather than to adsorbate-adsorbate (ClBz—ClBz) interaction.

Ordering of the adsorbate need not in all cases be due to adsorbate-substrate forces, but can be due to adsorbate-adsorbate interactions as in so-called "SAMs" (Self-Assembled Monolayers, made up, for example, of long-chain molecules) which favour patterned geometries even on amorphous solids. In this case, however, the extent of adsorbate ordering will increase with increasing coverage. An example of SAM-type behaviour is likely to be that of brominated long-chain hydrocarbons which have been shown to form highly-ordered adlayers on graphite at ~1 ML coverage (see ref. 4).

The chlorobenzene on silicon, used here, distributes itself in a recurring pattern over the F and U sites. The triangular F and U sites alternate across the entire silicon-wafer surface. The separation between the site centres, F and U, is 0.00155 microns (15.5 Å). The triangles (a pair of which, F+U, make up each unit cell) are equilateral with sides of 0.0027 microns. Patterned adsorption over F and U is achieved at room temperature without annealing.

By analogy with benzene (see ref. 2), it is thought that the monochlorinated benzene employed here at first adsorbs weakly in a mobile "precursor" state and then chemisorbs (with a heat of adsorption of ~1 eV) at the preferred site. The binding in the chemically-adsorbed condition is believed to involve a benzene ring (or in the present case a monochlorinated benzene ring) lying approximately flat upon the surface with its delocalized $\pi$-bonds overlapping the surface dangling-bonds located on the Si adatoms.

Those skilled in the art will understand that the experimental findings disclosed herein do not depend upon the correctness of the foregoing interpretation of the nature of the binding. Moreover, the theory being qualitative in nature does not purport to explain the preference for (benzene and) chlorobenzene adsorption at F in preference to U sites. Preferential binding of adsorbates to particular sites at surfaces (i.e., to particular atoms, or arrangements of atoms as in the case of the faulted half of the unit cell termed F) is a well known phenomenon. Since the preferred sites recur at regular intervals across the surface, the adsorbate molecules also recur, forming a pattern.

The experiments reported herein illustrate not only adsorbate patterning (required for the method disclosed herein) but also that effective excitation, such as by irradiation of the surface of a reactive solid, produces a pattern imprinted on the surface (a second requirement of the present method). The example of photopatterning that is disclosed herein is one in which a pattern of atoms is deposited on the surface in a chemically-bound state as a result of irradiation by ultraviolet. Central to the present method of photopatterning is that the adsorbate pattern or a closely-related one is imprinted on the surface by radiation-induced reaction with the surface, which reaction is localised to regions adjacent to the adsorbate molecules. It is only if reaction is "localised" that it will transfer the adsorbate pattern to the surface.

The existence of molecularly "localised scattering" of photofragments from substrates has been known, see refs. 17, 18. The surprising new finding disclosed herein, namely "localised reaction", takes the place of "localised scattering" when (due to such factors as the impact energy at the scattering site, the angle of impact and the nature of the impacted atom(s)) the localised scattering event is pre-empted by a localised perturbation of the surface leading to bond-formation at the site of impact. Hence the molecular or atomic species that would have been "scattered", instead "reacts" to bind chemically with the substrate surface to form, under the prevailing experimental conditions, involatile or (in the case of etching) volatile product. Reaction, rather than scattering, was obtained by replacing the inert halide substrate used in the scattering studies by the silicon employed here, well known to be reactive. It is recognised however, that even an "inert" substrate can exhibit reaction if the impacting species are themselves sufficiently reactive and energetic.

In view of the mobility of many species at surfaces, particularly energetic species formed as a result of radiation, the existence of localised reaction was not evident prior to its being demonstrated in the experiments disclosed herein. We return to this point later in this disclosure.

As we have noted, it is not the adsorbate patterning, described above, but the method that exploits such patterns through imprinting that constitutes the present invention. In the case that the adsorbate is chlorobenzene, the silicon surface has been imprinted on by irradiation of the adsorbate, as a pattern of chlorine atoms attached to Si dangling bonds not already occupied by the chlorobenzene adlayer. On the basis of extensive prior work (for example see ref 19) it is known that irradiation by ultraviolet (UV), or (in the case of low work-function materials) visible light, or irradiation by an external electron beam (see for example refs. 13, 14) causes reactions to occur. Such reactions may be initiated by photodissociation of the adlayer, or by interaction of the intact electronically-excited adlayer molecules with the substrate. Both categories of reaction can be assisted by the heating of the surface by the irradiation. The irradiation-induced reaction mechanisms will be reviewed shortly.

First, however, we report the observation disclosed herein that is central to the method claimed. The observation in question is that the irradiation-induced reaction occurs locally so as to imprint the adsorbate pattern, or a closely related pattern, on the underlying substrate. This has been demonstrated, in the examples given herein, by determining the adsorbate pattern on the atomic scale using STM, and comparing this with the pattern of reaction-product on the surface, also determined on the atomic scale using STM.

Figure 2:
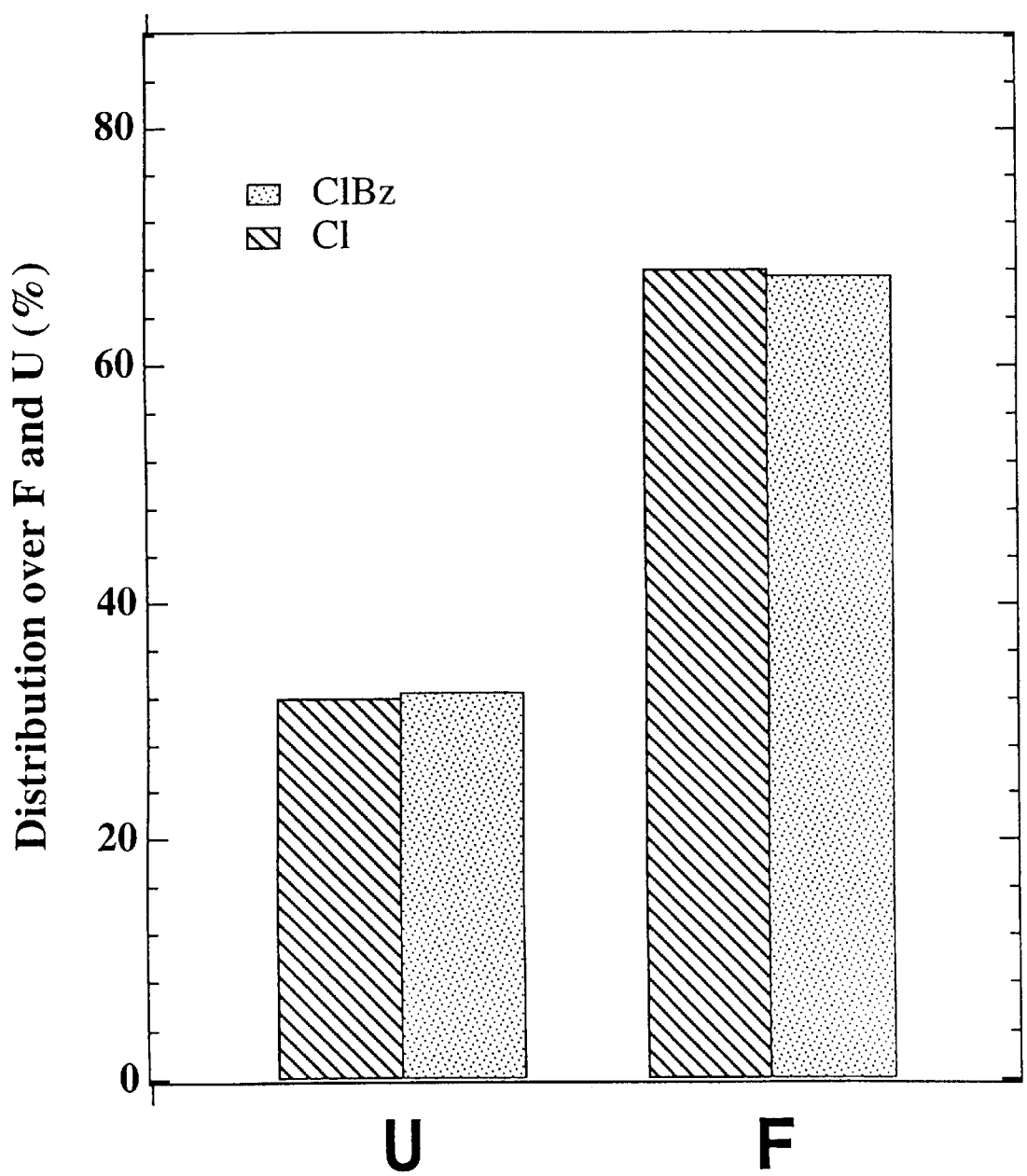
FIG. 2 is a bar graph obtained by counting individual ClBz molecules prior to irradiation, on F and U, and then counting Cl atoms, on F and U, which have been formed by irradiating the ClBz. The radiation was 193 nm ultraviolet from an excimer laser. Within the experimental (counting) error the F/U population ratio is the same for the parent ClBz as for the daughter Cl, indicative of "local" reaction.

FIG. 2 is a bar-graph from the present work showing that the pattern of adsorbate molecules (chlorobenzene at approx. 0.4 monolayer coverage) is converted, by irradiation using a 193 nm excimer laser irradiation, into a similar pattern of imprinted Cl over F and U sites on Si(111)7×7. Following irradiation with 193 nm (typically $10^3$ pulses at 175 mJ/$cm^2$·pulse), and only following irradiation, the STM revealed the presence of Cl at the surface. The Cl bonded to the surface as Cl—Si showed up as additional dark areas at −1V that, in contrast to chlorobenzene adsorbate dark areas, became light when the tip voltage was changed to −2V or greater negative voltage, as illustrated in FIG. 1. These dark areas at −1V, which became light at −2V, were found to be a consequence of the irradiation, showing that Cl—Si had been formed by irradiation of ClBz adsorbed on the surface. The ratios F/U given in FIG. 2 for the parent molecule, namely adsorbed ClBz, and the corresponding ratio for the daughter species, namely Cl—Si, are identical to within an estimated measurement error of ±5% in determining F/U. The ratio F/U was obtained by recording the location of the individual ClBz molecules and Cl atoms (the latter in the form of Cl—Si) by STM.

As already noted, all experiments were performed under UHV, so gas-phase dissociation by the irradiation was negligible. Those skilled in the art will understand that this process is not limited to UHV, but can be utilised wherever ordered adsorbates are in contact with substrates.

The mechanisms by which irradiation could trigger reaction to break the Cl—C bonds which are present in chlorobenzene and form Cl—Si bonds at the surface, will be discussed later. It involves speculation that goes beyond what is essential to the invention. Referring again to FIG. 2, a very surprising observation is that the distribution of Cl over F and U sites at the Si crystal surface was, within experimental error, indistinguishable from that of ClBz. (This, it should be noted, would not be the case if atomic Cl formed in the gas-phase were to impinge at the surface, since this would distribute Cl randomly).

The agreement between the distribution of the daughter fragments, Cl, over F and U sites with the distribution of the parent molecules, ClBz, over these same sites, leaves no doubt that the irradiation causes localised reaction at the Si surface. This surprising result, namely the finding of localised reaction proves the principle on which is based the method of molecular-scale irradiation-induced patterning disclosed here.

The fact that irradiation of the adsorbate+substrate gives rise to localised reaction, thereby transferring the pattern of adsorbate to the substrate, has not previously been demonstrated, nor could this surprising result have been assumed to be the case in the absence of experimental proof. It has been noted above that the parent adsorbate molecule, chlorobenzene, adsorbed at room temperature, even with no excess energy, is initially highly mobile on the surface. Correspondingly, electronically-excited adsorbate, ClBz*, formed by irradiation, or the atomic chlorine into which it dissociates, might have proved, when first formed at the surface, to be similarly mobile, thereby losing its "memory" of the patterned arrangement of the parent ClBz and consequently failing to react to form a pattern at the surface.

According to this plausible scenario irradiation of the patterned adsorbate would give rise to a random imprint at the surface. This outcome (which is not, however, the outcome found in the present invention) is rendered still more plausible by the fact that Cl (unlike ClBz) is for the most part released at the surface, following energetic irradiation such as UV, with a substantial initial translational energy, in the electron-volt range. Since, as shown in FIG. 2, the Cl reacts at the surface in a highly localised fashion reflecting the distribution of the parent molecule ClBz, it appears that this excess translational energy carries the atom through any loosely-bound mobile-precursor state, of the type postulated for ClBz, directly into the strongly chemically-bound state Cl—Si. The Cl—Si has a substantial binding energy, in the region of 4–5 eV (see for example refs. 15).

A further possible rationale for the observed localised outcome is that translationally-excited Cl is never present as a free atom but promptly undergoes an exchange reaction in which excited ClBz* formed by irradiation breaks its Cl—C bond simultaneously with the formation of a Cl—Si bond of comparable strength binding Cl to the surface. Since such an exchange reaction can occur on a time-scale of femtoseconds, there is no opportunity for extensive migration across the surface. We have obtained circumstantial evidence for this type of irradiation-induced exchange reaction as a mechanism for halogenating a reactive substrate (silver in that case) in earlier work (see for example ref. 10, 11). The earlier work did not, however, give any evidence whatever as to the localised or delocalised nature of the outcome.

Those skilled in the art will appreciate that the molecular mechanics of the exchange reaction postulated in the previous paragraphs does not constitute an element in the invention. The same applies to the discussion of the ways in which irradiation can be effective in triggering the reaction, to be discussed below.

The mechanisms by which irradiation triggers adsorbate reaction are (a) through the direct absorption of radiation by the adlayer to form reactive electronically-excited molecules at the adsorbate-surface interface (see ref. 7, 19), (b) through electronic excitation in the substrate (for semiconductors this is likely to involve formation of electron-hole pairs at or near the surface) followed by electronihc-to-electronic energy-transfer to the adsorbate to yield reactive excited-states of the neutral adsorbate (see ref. 12), (c) through electronic excitation in the substrate (as in (b)) but followed by the transfer of charge to or from the adsorbate to yield reactive adsorbate ions (see ref. 10, 11), and finally (d) in the case of bombardment with an external electron-source, attachment of impacting electrons to the adsorbate with subsequent reaction of the adsorbate anion (negative ion) or its dissociation products (see ref. 13, 14). The 193 nm irradiation of chlorobenzene adsorbed on a silicon wafer, described herein, is believed to involve processes (a), (b) and (c) (direct excitation, energy-transfer excitation and electron-transfer excitation) in relative amounts that are unknown but need not be known in order to effect the photopatterning.

While photoirradiation or electron beam bombardment has been the preferred means for exciting the adsorbate or substrate in work until now, it will be understood that particle bombardment by, for example, positively or negatively charged ions may be preferred in some circumstances.

Those skilled in the art will appreciate there are numerous uses to which this method of photo-impact, electron-impact or ion-impact patterning of surfaces can be put. Broadly they are irradiation induced "writing", "doping", and "etching", all under digital control since in each application the number of photons, electrons or ions "in" determines the number of atoms "out". "Writing" involves deposition at the surface; in this case the output (designated "out" above) is material attached to the surface. This is exemplified herein by the example of patterned chlorination at the surface of silicon. "Doping" will be the output if the written material is buried, either because its recoil-momentum away from the excited parent molecule drives it into the surface, or if, following its deposition at the surface, it is buried by subsequent growth of one or more additional layers at the surface. In either case, patterned "doping" represents a minor variant on patterned "writing", the important step in each case being the same, namely radiation-induced localised reaction. The "etching" output involves an entirely comparable localised removal of surface atoms. With some substrates this can be achieved "directly" by abstraction reaction from the surface, such as that involving energetic halogen atoms. The preferred agent for localised reaction would then be a fluorine-containing adsorbate molecule, for example fluorobenzene rather than chlorobenzene, a minor variant. The essential requirement for direct etching is that the patterned reaction give a product that is a vapour, or can be vaporized by heating. Localised etching can also be achieved through a two-step process, which has been exemplified and demonstrated. The first step is patterned photochlorination disclosed herein, and the second is further UV irradiation at 193 nm which has shown to give preferential photoejection at the site of chlorination. Both these steps are "digitally" controlled processes (see ref. 15).

Successive adsorption-irradiation cycles will cause the annealed adsorbate layer (prior to irradiation) to seek out the sites at which the first pattern was imprinted, thus "reinforcing" the first imprint. Thus adsorbates will collect preferentially in the region of a "pit" in the surface to form a pattern (see ref. 16). When, therefore, a second application of adsorbate is followed by irradiation, reaction will occur once more at the sites of the prior imprinting (this being the site of secondary adsorption). Thus secondary and subsequent patterned-adsorption plus irradiation-imprinting can be used to enlarge, or chemically change, a primary imprint. The primary imprint may have been made by the present method or alternatively by the tip of an atomic writing/etching instrument such as a STM (ref. 9). This "reinforcing" application will be important in permitting the uses of this method to increase the size of primary "pits" in a secondary and subsequent "etches", and to write or dope with selected adsorbates in the vicinity of a prior mark.

Since adsorbates (especially following annealing to a temperature slightly below the desorption temperature) generally show ordering due to one or both of the two causes stated above (namely patterned bonding to an ordered substrate surface or ordering due to adsorbate-adsorbate forces) a wide range of adsorbates can be used in this molecular-patterning approach. The further requirement that the adsorbate reacts with an underlying solid following irradiation by photons, electrons or ions will also be met when bond-rupture in the adsorbate molecule gives rise to energetic highly-reactive free radicals including reactive atoms which can chemically react with the surface of the solid. The selection of adsorbate can be made from a large number of gases that have been used for radiation-induced writing and doping (e.g., halides, hydrides and oxides, metal organics, compounds of Si, Ga, As and In etc.—all well known to those skilled in the art of Chemical Vapor Deposition, CVD) and gases used for plasma-etching (the most effective agents in this case being fluorides).

These three processes to which this method of molecular-scale imprinting can be applied—writing, doping and etching—are all currently employed in a broad range of devices that fall under the generic name of microcircuitry. The method of patterned imprinting disclosed here opens the way to miniaturisation of these devices into the nanometre regime, an as yet unrealized goal of microelectronics. Other methods seeking to provide nanometre-scale pattern formation to date have not exploited the principles of the present method.

For example, the method disclosed in U.S. Pat. No. 5,129,991 to Gilton differs in several important respects from the method disclosed herein: (i) the adsorbed gas is not required to form a pattern but is uniformly distributed in Gilton, (ii) the pattern of etching is due to the presence of macroscopic "regions" in the substrate, with differing photoemission thresholds; and (iii) the "localised" nature of the radiation-induced reaction is a localisation to reaction with large-scale regions of the substrate rather than molecular-scale regions.

The present invention also differs from Yan et al., in several important respects. For example, in the method disclosed herein the pattern imprinted at the surface or a closely-related pattern is pre-existent in an adsorbed layer, and the process of imprinting in the present method is triggered by irradiation. Yan et al. did not disclose a layer of adsorbate, under the conditions of their experiment, nor a patterned layer, nor did they irradiate the surface of the substrate.

The foregoing description of the preferred embodiments of the process for marking or imprinting patterns onto surfaces has been presented to illustrate the principles of the invention and not to limit the invention to the particular embodiment illustrated. It is intended that the scope of the invention be defined by all of the embodiments encompassed within the following claims and their equivalents.

REFERENCES

1. V. M. Hallmark et al., Phys. Rev. Lett. 70, 3740 (1993).
2. R. A. Wolkow et al., J. Chem. Phys. 103, 10696 (1995).
3. "The Adsorption of $C_6H_5Cl$ on Si(111)7×7 Studied by STM", X. H. Chen et al., Surf. Sci. 340, 224 (1995).
4. "Functional Group Identification in Scanning Tunnelling Microscopy of Molecular Adsorbates", Donna M. Cyr et al., J. Phys. Chem, 100, 13747 (1996).
5. "Structure of Adsorbates on Alkali Halides (Theory). I. HBr on LiF (001)", J. C. Polanyi et al., J. Chem. Phys. 94, 978 (1991).
6. "Dynamics of Surface Aligned Photochemistry (Theory) ". II, Localised H-atom Scattering in the HBr(ad) LiF (001)+hv System", V. J. Barclay et al., J. Chem. Phys. 97, 9458 (1992).
7. "Dynamics of Adsorbate Photochemistry", J. C. Polanyi et al., in Laser Spectroscopy and Photochemistry on Metal Surfaces, Advanced Series in Physical Chemistry—Vol. 5 eds. H-L. Dai and W. Ho (World Scientific Publishing Co. Ltd., Singapore, 1995), Chapter 26, p. 1241.
8. "Chemistry In Two Dimensions: Surfaces", G. Somorjai, Cornell U. Press, 1981; Chapter 5, p. 19.
9. "Manipulation of Matter At The Atomic And Molecular Levels", P. Avouris, Acc. Chem. Res. 28, 95 (1995).
10. "Photochemistry of Adsorbed Molecules. XI. Charge-Transfer Photodissociation and Photoreaction in Chloromethanes on Ag(111)", St. J. Dixon-Warren et al., J. Chem. Phys. 98, 5983 (1993).
11. "Photochemistry of Adsorbed Molecules. XII. Photoinduced Ion-Molecule Reactions at a Metal Surface For $CH_3X/RCl/Ag(111)$ (X=Br; I)", St. J. Dixon-Warren et al., J. Chem. Phys. 98, 5954 (1993).
12. "Photochemistry of Adsorbed Molecules. V. Ultraviolet Photodissociation of OCS on LiF(001)", K. Leggett et al., J. Chem. Phys., 93, 3645 (1990).
13. L. Sanche and L. Parenteau, Phys. Rev. Lett. 59, 136 (1987).
14. "Electron-Driven Dynamics at the Gas-Solid Interface— Dissociation, Desorption and Reaction of Adsorbed Molecules", R. J. Guest et al., Faraday Discuss. 96, 117 (1993).
15. "Photoetching of Si(111)7×7 Studied by STM", X. Y. Chen et al., Surf. Sci. 376, 77 (1997).
16. "Spatially Confined Chemistry: Fabrication of Ge Quantum Dot Arrays", J. R. Heath et al., J. Chem. Phys. 100 3144 (1996).
17. "Dynamics of Surface-Aligned Photochemistry (Theory), II. Localised H-Atom Scattering in the Hbr (001)/LiF(001)+hv System", V. J. Barclay et al., J. Chem. Phys. 97, 9458 (1992).
18. "Photochemistry of Adsorbed Molecules. XN, Localised Atomic Scattering in the Photolysis of HI/LiF(001) and HINaF(001)", V. J. Barclay et al., J. Chem. Phys. 105, 5005 (1996).
19. "Laser Spectroscopy and Photochemistry on Metal Surfaces", Advanced Series on Physical Chemistry-Vol.

5, eds. H-L Dai and W. Ho, Part II (Pub. World Scientific, 1995), Part IV, Chapters 24–27, p. 1045–1335.

Therefore what is claimed is:

1. A method of patterning a surface of a solid on a molecular scale, comprising:

provicing a reactive solid having a surface;

forming a pattern of adsorbed molecules at sites on said surface of said reactive solid by providing a plurality of preselected molecules and exposing said surface to said preselected molecules; and forming an imprinted pattern covering less than every surface atom on said surface by irradiating the surface and the pattern of the adsorbed molecules with effective excitation energy to form a chemical bond between at least one constituent of the adsorbed molecules and the reactive solid locally to the sites where the adsorbed molecules are adsorbed on said surface.

2. The method according to claim 1 wherein said reactive solid is selected from the group consisting of a crystalline solid and an amorphous solid.

3. The method according to claim 1 wherein irradiating with the effective excitation energy includes irradiation by light radiation of sufficient energy to induce said chemical bond formation.

4. The method according to claim 1 wherein irradiating with the effective excitation energy includes exciting electrons in said reactive solid by radiation to an energy level sufficient to induce said chemical bond formation between said adsorbed molecules and said reactive solid.

5. The method according to claim 1 wherein irradiating with the effective excitation energy includes bombardment of said adsorbed molecules with particles of sufficient energy to induce said bond formation between said adsorbed molecules and said reactive solid.

6. The method according to claim 5 wherein said particles are a beam of electrons.

7. The method according to claim 5 wherein said particles are a beam of positive or negative ions.

8. The method according to claim 1 wherein said surface is exposed to said preselected molecules in gas phase.

9. The method according to claim 1 wherein said surface is exposed to said preselected molecules in liquid phase.

10. The method according to claim 1 wherein the reactive solid and the preselected molecules are selected on the basis that irradiating with the effective excitation energy includes irradiation of said adsorbed molecules by radiation of sufficient energy to induce said bond formation between a molecular or atomic fragment of said adsorbed molecules and said reactive solid.

11. The method according to claim 1 wherein irradiating with the effective excitation energy includes joint bombardment of said adsorbed molecules and the reactive solid with particles of sufficient energy to induce said bond formation between said adsorbed molecules and said reactive solid.

12. The method according to claim 1 including applying further excitation to said imprinted surface by irradiation, wherein the reactive solid and the preselected molecules are selected on the basis that applying further excitation energy to said imprinted surface by irradiation effects ejection of atoms from said surface thereby producing an atomic scale surface pitting pattern substantially the same as said imprinted pattern.

13. The method according to claim 2 wherein said crystalline solid is a semiconductor.

14. The method according to claim 13 wherein said semiconductor is selected from the group consisting of silicon, gallium arsenide and indium phosphide.

15. The method according to claim 1 wherein said preselected molecules are selected from the group consisting of halides, hydrides, oxides and metal-organic compounds.

16. The method according to claim 1 wherein the reactive solid and the preselected molecules are selected to give a self-assembled monolayer wherein the pattern of adsorbed molecules forms due to forces between said adsorbed molecules.

17. The method according to claim 1 wherein said at least one constituent is the adsorbed molecule itself intact.

18. The method according to claim 1 wherein the reactive solid and the preselected molecules are selected on the basis that irradiating with the effective excitation energy breaks chemical bonds in the adsorbed molecules and forms the chemical bond between the at least one constituent of the adsorbed molecules and the reactive solid.

19. The method according to claim 1 wherein the imprinted pattern is substantially identical to the pattern of adsorbed molecules.

20. The method according to claim 1 wherein the imprinted pattern is not identical to the pattern of adsorbed molecules but derives from it.

21. A method of patterning a surface of a solid on a molecular scale, comprising:

providing a reactive crystalline solid having a surface;

forming a pattern of adsorbed molecules at sites on said surface of said reactive crystalline solid by providing a plurality of preselected molecules and exposing said surface to said preselected molecules in gas phase; and forming an imprinted pattern covering less than every surface atom on said surface by irradiating the surface and the pattern of the adsorbed molecules with effective excitation energy to form a chemical bond between at least one constituent of the adsorbed molecules and the reactive crystalline solid locally to the sites where the adsorbed molecules are adsorbed on said surface.

22. The method according to claim 21 wherein irradiating with the effective excitation energy includes irradiation by light radiation of sufficient energy to induce said chemical bond formation.

23. The method according to claim 21 wherein irradiating with the excitation energy includes bombardment of said adsorbed molecules with particles of sufficient energy to induce said bond formation between said adsorbed molecules and said reactive crystalline solid.

24. The method according to claim 23 wherein said particles are a beam of electrons.

25. The method according to claim 23 wherein said particles are a beam of positive or negative ions.

26. The method according to claim 21 wherein exposing said surface to said preselected molecules includes annealing said adsorbed molecules prior to irradiating with said excitation energy.

27. The method according to claim 21 wherein the reactive crystalline solid and the preselected molecules are selected on the basis that irradiating with the effective excitation energy includes irradiation of said adsorbed molecules by radiation of sufficient energy to induce said bond formation between a molecular or atomic fragment of said adsorbed molecules and said reactive solid.

28. The method according to claim 21 wherein the imprinted pattern is produced by selecting said reactive solid and the preselected molecules so that applying the effective excitation energy induces chemical reaction of the adsorbed molecules with said surface to form a product that vaporizes, or is vaporized upon heating.

29. The method according to claim 21 wherein the reactive crystalline solid and the preselected molecules are selected on the basis that irradiating with the effective excitation energy breaks chemical bonds in the adsorbed molecules and forms the chemical bond between the at least one constituent of the adsorbed molecules and the reactive solid.

30. The method according to claim 21 including applying further excitation to said imprinted surface by irradiation, wherein the reactive crystalline solid and the preselected molecules are selected on the basis that applying the further excitation energy to said imprinted surface effects ejection of atoms from said surface thereby producing an atomic scale surface pitting pattern substantially the same as said imprinted pattern.

31. The method according to claim 21 wherein applying the excitation energy is by joint bombardment of said adsorbed molecules and reactive crystalline solid with particles of sufficient energy to induce chemical reaction of said adsorbed molecules with said surface.

32. The method according to claim 21 wherein applying the excitation energy is by electronic-to-electronic energy-transfer from said reactive crystalline solid to said adsorbed molecules to induce chemical reaction of said adsorbed molecules with said surface.

33. The method according to claim 21 wherein said reactive crystalline solid is a semiconductor.

34. The method according to claim 33 wherein said semiconductor is selected from the group consisting of silicon, gallium arsenide and indium phosphide.

35. The method according to claim 21 wherein said preselected molecules are selected from the group consisting of halides, hydrides, oxides and metal-organic compounds.

36. The method according to claim 21 wherein the reactive crystalline solid and the preselected molecules are selected on the basis that the adsorbate pattern forms due to forces between said adsorbate molecules and said surface.

37. The method according to claim 21 wherein the reactive crystalline solid and the preselected molecules are selected to give a self-assembled monolayer wherein the pattern of adsorbed molecules forms due to adsorbate-adsorbate forces.

* * * * *